United States Patent
Tsukihara et al.

(10) Patent No.: US 12,350,743 B2
(45) Date of Patent: Jul. 8, 2025

(54) CUTTING TOOL

(71) Applicant: Sumitomo Electric Industries, Ltd., Osaka (JP)

(72) Inventors: Nozomi Tsukihara, Osaka (JP); Haruyo Fukui, Osaka (JP); Toshihiro Tabata, Osaka (JP); Koji Kuramochi, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 18/577,284

(22) PCT Filed: May 17, 2023

(86) PCT No.: PCT/JP2023/018429
§ 371 (c)(1),
(2) Date: Jan. 8, 2024

(87) PCT Pub. No.: WO2024/236768
PCT Pub. Date: Nov. 21, 2024

(65) Prior Publication Data
US 2024/0383045 A1   Nov. 21, 2024

(51) Int. Cl.
*B23B 27/14*   (2006.01)
*C23C 14/06*   (2006.01)
*C23C 14/32*   (2006.01)

(52) U.S. Cl.
CPC ........ *B23B 27/148* (2013.01); *C23C 14/0647* (2013.01); *C23C 14/0664* (2013.01); *C23C 14/325* (2013.01); *B23B 2228/105* (2013.01)

(58) Field of Classification Search
None
See application file for complete search history.

(56) References Cited

U.S. PATENT DOCUMENTS

| | | | | |
|---|---|---|---|---|
| 2015/0050490 | A1* | 2/2015 | Kumar | C23C 14/024 106/286.2 |
| 2020/0114431 | A1 | 4/2020 | Koike et al. | |
| 2023/0265565 | A1* | 8/2023 | Koike | B23B 27/14 427/419.7 |

FOREIGN PATENT DOCUMENTS

| | | | |
|---|---|---|---|
| JP | H06-262405 | A | 9/1994 |
| JP | H1135327 | A * | 7/1997 |
| JP | 2009-155721 | A | 7/2009 |
| JP | 2009-275293 | A | 11/2009 |
| JP | 2010-017791 | A | 1/2010 |
| JP | 2010-174375 | A | 8/2010 |
| JP | 2022-095116 | A | 6/2022 |
| WO | 2019/181742 | A1 | 9/2019 |
| WO | WO-2022130706 | A1 * | 6/2022 ............. B23B 27/14 |

OTHER PUBLICATIONS

Bib Data and Translation—JPH1135327 A; Tadashi Doi Yoshihiko; Jul. 18, 1997 (Year: 1997).*

(Continued)

*Primary Examiner* — Seth Dumbris
(74) *Attorney, Agent, or Firm* — XSENSUS LLP

(57) ABSTRACT

A cutting tool, including: a base; and a coating disposed on the base, wherein the coating includes a first layer composed of hexagonal $W(C_{1-a}N_a)_x$, a represents 0.3 or more and 0.8 or less, and x represents 0.8 or more and 1.2 or less.

9 Claims, 2 Drawing Sheets

(56) References Cited

OTHER PUBLICATIONS

Chuang, et al., "Growth of Ternary WCxNy Thin Films from a Single-source Precursor, W(NtBu)2(NEt2)2", 2006, Journal of the Chinese Chemical Society, Iss. 53, pp. 1391-1395. (Year: 2006).*
Written Opinion mailed on Aug. 1, 2023, received for PCT Application PCT/JP2023/018429, filed on May 17, 2023, 6 pages including English Translation.

* cited by examiner

CUTTING TOOL

CROSS-REFERENCE TO RELATED APPLICATIONS

This application is a national stage application, pursuant to 35 U.S.C. § 371, of International Patent Application No. PCT/JP2023/018429, filed May 17, 2023, the entire contents of which are incorporated herein by reference.

TECHNICAL FIELD

The present disclosure relates to a cutting tool.

BACKGROUND ART

For a purpose of lengthening a lifetime of a cutting tool, various investigation have been made. Japanese Patent Laying-Open No. 2022-095116 (PTL 1) discloses a cutting tool comprising a base and a coating disposed on the base, wherein the coating includes a first layer composed of metal tungsten and hexagonal ditungsten carbide.

CITATION LIST

Patent Literature

PTL 1: Japanese Patent Laying-Open No. 2022-095116

SUMMARY OF INVENTION

A cutting tool of the present disclosure is a cutting tool comprising:
a base; and
a coating disposed on the base, wherein
the coating includes a first layer composed of hexagonal $W(C_{1-a}N_a)_x$,
a represents 0.3 or more and 0.8 or less, and
x represents 0.8 or more and 1.2 or less.

DETAILED DESCRIPTION

Figure 1:
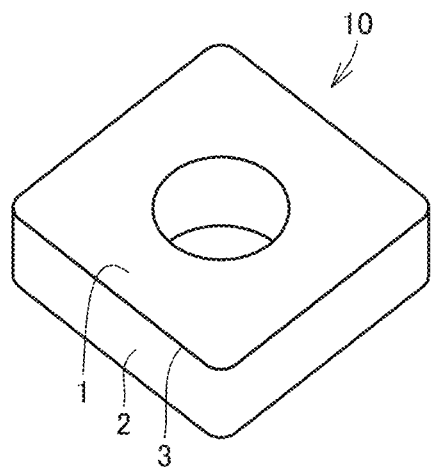
FIG. 1 is a perspective view that exemplifies an aspect of a cutting tool.

Problem to be Solved by the Present Disclosure

A cutting tool that has a long tool lifetime even under an environment with a high thermal load such as turning of titanium alloy is required.

Accordingly, an object of the present disclosure is to provide a cutting tool that has a long tool lifetime even under an environment with a high thermal load such as, specifically, turning of titanium alloy.

Advantageous Effect of the Present Disclosure

The cutting tool of the present disclosure can have a long tool lifetime even under an environment with a high thermal load such as, specifically, turning of titanium alloy.

Description of Embodiments

First, aspects of the present disclosure will be listed and described.

(1) A cutting tool of the present disclosure is a cutting tool comprising:
a base; and
a coating disposed on the base, wherein
the coating includes a first layer composed of hexagonal $W(C_{1-a}N_a)_x$,
a represents 0.3 or more and 0.8 or less, and
x represents 0.8 or more and 1.2 or less.

The cutting tool of the present disclosure can have a long tool lifetime even under an environment with a high thermal load such as, specifically, turning of titanium alloy.

(2) According to the (1), an X-ray diffraction spectrum of the first layer may have a peak within a range of a diffraction angle 2θ of 46.0° or more and 47.0° or less.

The peak within a range of a diffraction angle 2θ of 46.0° or more and 47.0° or less (hereinafter, also referred to as "the first peak") is a peak derived from a (105) plane of the hexagonal tungsten nitride. When the X-ray diffraction spectrum of the first layer has the first peak, the heat resistance of the coating is more improved.

(3) According to the (1) or (2), a thickness of the first layer may be 0.3 μm or more and 4.0 μm or less. According to this, the tool lifetime is further improved.

(4) According to any of the (1) to (3),
the coating may further include a second layer provided on a side opposite to the base of the first layer, and
the second layer may be composed of: at least one element selected from a first group consisting of periodic table group 4 elements, group 5 elements, group 6 elements, aluminum, and silicon; or a compound composed of at least one element selected from the first group and at least one element selected from a second group consisting of carbon, nitrogen, oxygen, and boron.

According to this, the tool lifetime is further improved.

(5) According to any of the (1) to (4),
the coating may further include a third layer disposed between the base and the first layer, and
the third layer may be composed of: at least one element selected from a first group consisting of periodic table group 4 elements, group 5 elements, group 6 elements, aluminum, and silicon; or a compound composed of at least one element selected from the first group and at least one element selected from a second group consisting of carbon, nitrogen, oxygen, and boron.

According to this, the tool lifetime is further improved.

(6) According to any of the (1) to (5), the base may contain at least one selected from the group consisting of a cemented carbide, a cermet, a high-speed steel, a ceramic, a cubic boron nitride sintered material, and a diamond sintered material. According to this, the tool has excellent hardness and strength at high temperature.

DETAILED DESCRIPTION OF EMBODIMENTS

With reference to the drawings, specific examples of the cutting tool of an embodiment of the present disclosure (hereinafter, also referred to as "the present embodiment") will be described hereinafter. In the drawings of the present disclosure, a same reference sign represents same parts or corresponding parts. Dimensions such as length, width, thickness, and depth are appropriately modified to clarify and simplify the drawings, and do not always represent actual dimensions.

A description in the form of "A to B" herein means an upper and lower limits of a range (that is, A or more and B or less). When A has no description of a unit and only B has a description of a unit, the unit of A and the unit of B are same.

When a compound and the like are represented by a chemical formula herein, any conventionally known atomic ratios are included unless the atomic ratio is particularly limited, and should not be necessarily limited to an atomic ratio within a stoichiometric range.

Embodiment 1: Cutting Tool

The cutting tool according to an embodiment of the present disclosure will be described by using FIG. 1 to FIG. 4.

Figure 2:
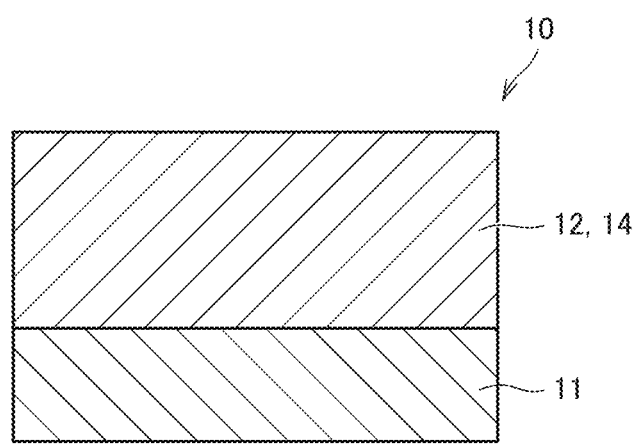
FIG. 2 is a schematic enlarged sectional view of an example of a cutting tool according to Embodiment 1.

As illustrated in FIG. 2, a cutting tool 10 according to an embodiment of the present disclosure (hereinafter, also referred to as "Embodiment 1") is a cutting tool comprising:
a base 11; and
a coating 14 disposed on base 11, wherein
the coating includes a first layer 12 composed of hexagonal $W(C_{1-a}N_a)_x$,
a represents 0.3 or more and 0.8 or less, and
x represents 0.8 or more and 1.2 or less.

The cutting tool of the present embodiment can have a long tool lifetime even under an environment with a high thermal load such as, specifically, turning of titanium alloy. The reason is presumably as follows.

The first layer is composed of the hexagonal $W(C_{1-a}N_a)_x$. Since the first layer contains C (carbon), a frictional coefficient on a contacting interface with a workpiece can be reduced to reduce cutting resistance. As a result, the cutting tool that includes the first layer has improved wear resistance and an improved tool lifetime.

Since the first layer contains N (nitrogen), the heat resistance is improved compared with WC. As a result, the cutting tool that includes the first layer improves oxidation resistance and improves the tool lifetime in process in which the cutting edge becomes hot, such as dry cutting processing.

<Cutting Tool>

The cutting tool of the present embodiment may be, for example, a drill, an endmill, an indexable cutting insert for a drill, an indexable cutting insert for an endmill, an indexable cutting insert for milling, an indexable cutting insert for turning, a metal saw, a gear-cutting tool, a reamer, a tap, and the like.

FIG. 1 is a perspective view that exemplifies an aspect of the cutting tool. The cutting tool that has such a shape is used as, for example, an indexable cutting insert. Cutting tool 10 has a rake face 1, a flank face 2, and a cutting edge ridgeline 3 with crossing rake face 1 and flank face 2. That is, rake face 1 and flank face 2 are faces continued across cutting edge ridgeline 3. Cutting edge ridgeline 3 constitutes an end of the cutting edge of cutting tool 10. Such a shape of cutting tool 10 can also be grasped as a shape of the base of the cutting tool. That is, the base has a rake face, a flank face, and a cutting edge ridgeline with crossing the rake face and the flank face.

<Base>

As the base of the present embodiment, any known bases conventionally known as this type of base may be used. For example, the base preferably contains at least one selected from the group consisting of a cemented carbide (for example, tungsten carbide (WC)-based cemented carbide, cemented carbide containing Co in addition to WC, cemented carbide in which a carbonitride of Cr, Ti, Ta, Nb, or the like is added in addition to WC, and the like), a cermet (cermet that mainly contains TIC, TiN, TiCN, and the like), a high-speed steel, a ceramic (such as titanium carbide, silicon carbide, silicon nitride, aluminum nitride, and aluminum oxide), a cubic boron nitride sintered material (cBN sintered material), and a diamond sintered material. The base more preferably contains at least one selected from the group consisting of a cemented carbide, a cermet, and a cBN sintered material.

When the cemented carbide is used as the base, such a cemented carbide exhibits the effect of the present embodiment even when containing free carbon or an abnormal phase called as a η-phase in the structure. A surface of the base used in the present embodiment may be modified. For example, in the case of the cemented carbide, a β-free layer may be formed on the surface, and in the case of the cermet, a surface-hardened layer may be formed. Even when the surface is modified as above, the effect of the present embodiment is exhibited.

When the cutting tool is an indexable cutting insert (such as an indexable cutting insert for milling), the base includes one that has a chip breaker and one that has no chip breaker. The shape of the cutting edge ridgeline includes any of: a sharp-edge shape (ridge with crossing the rake face and the flank face); a hone-processed shape (rounded sharp edge); a negative-land-processed (chamfered) shape; and the honing-processed and negative-land-processed shape in combination.

<Coating>

The "coating" according to the present embodiment has an action of improving characteristics such as breakage resistance and wear resistance of the cutting tool by coating at least a part of the base (for example, a part contacted with a workpiece during cutting processing and involved in cutting). The coating may coat at least the part involved in cutting. The coating may coat an entire surface of the base. A partially different constitution of the coating does not depart from the scope of the present embodiment. The part of the base involved in cutting means a region on the surface of the base where a distance from a cutting edge ridgeline is within 50 µm, for example. The coating may coat an entire surface of the part of the base involved in cutting. As long as the effect exhibited by the cutting tool of the present disclosure is not impaired, a coating that does not coat a part of the part of the base involved in cutting does not depart from the scope of the present embodiment.

The coating includes a first layer composed of hexagonal $W(C_{1-a}N_a)_x$. FIG. 2 is a schematic enlarged sectional view of the cutting tool of an aspect of the present embodiment. As illustrated in FIG. 2, first layer 12 may be provided directly on base 11.

Figure 3:
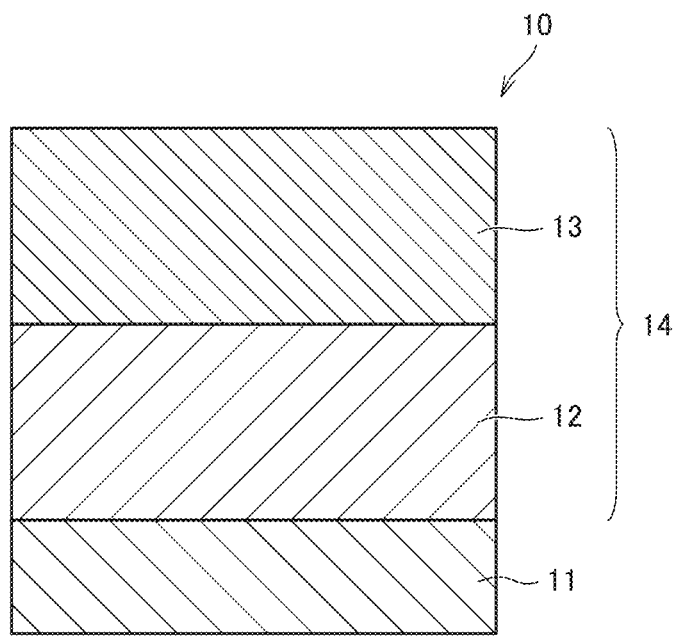
FIG. 3 is a schematic enlarged sectional view of another example of a cutting tool according to Embodiment 1.
Figure 4:
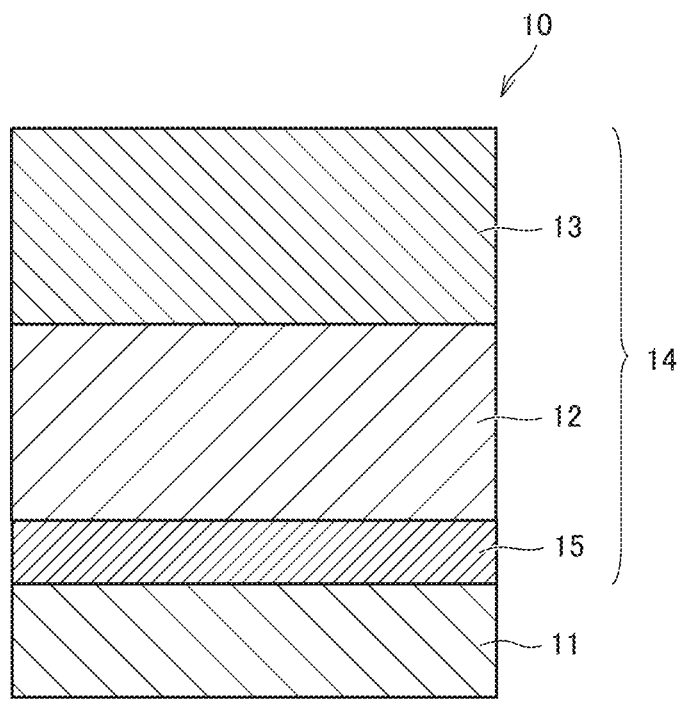
FIG. 4 is a schematic enlarged sectional view of another example of a cutting tool according to Embodiment 1.

The coating may include another layer in addition to first layer 12. Examples of the other layer include: a third layer 15 disposed between base 11 and first layer 12, as illustrated in FIG. 4; and a second layer 13 disposed on a side opposite to base 11 of first layer 12, as illustrated in FIG. 3 and FIG. 4.

A thickness of the coating may be 0.3 µm or more and 10 µm or less, may be 0.5 µm or more and 10 µm or less, may be be 1 µm or more and 6 µm or less, or may be 1.5 µm or more and 4 µm or less. If the thickness of the coating is less than 0.1 µm, the wear resistance tends to be deteriorated. If the thickness of the coating exceeds 10 µm, the coating tends to be frequently peeled or broken when, for example, a large stress is applied between the coating and the base in intermittent processing.

The thickness of the coating herein means a total of each thickness of layers that constitute the coating, such as the first layer, the second layer, and the third layer, described later. The thickness of the coating is measured by measuring a cross-sectional sample parallel to a normal direction of the surface of the base at given three points by using a transmission electron microscope (TEM), and averaging the measured thicknesses at the three points. Examples of the transmission electron microscope include a spherical aberration correction device "JEM-2100F (trademark)", manufactured by JEOL Ltd. A thickness of each layer described later is also measured in the same manner unless otherwise mentioned.

<First Layer>

The coating includes the first layer composed of hexagonal $W(C_{1-a}N_a)_x$ (a represents 0.3 or more and 0.8 or less, and x represents 0.8 or more and 1.2 or less). The hexagonal $W(C_{1-a}N_a)_x$ means $W(C_{1-a}N_a)_x$ that has a hexagonal crystal structure. The crystal structure of the first layer that is hexagonal inhibits a diffusion reaction between the coating and a workpiece to reduce agglutination of the workpiece, leading to an improved tool lifetime. The first layer can improve heat resistance, oxidation resistance, and wear resistance of the coating.

The first layer may contain an inevitable impurity in addition to the hexagonal $W(C_{1-a}N_a)_x$ within a range that does not impair the effect exhibited by the cutting tool according to the present embodiment. Examples of the inevitable impurity include iron (Fe), calcium (Ca), zinc (Zn), sodium (Na), fluorine (F), nickel (Ni), molybdenum (Mo), and chromium (Cr). A content rate of the inevitable impurity is preferably 0 mass % or more and 0.2 mass % or less relative to a total mass of the first layer. The content rate of the inevitable impurity is measured by glow discharge mass spectrometry. The "second layer" and the "third layer", described later, may also contain an inevitable impurity within a range that does not impair the effect exhibited by the cutting tool of the present embodiment.

<Crystal Structure of First Layer>

The fact that the first layer is composed of $W(C_{1-a}N_a)_x$ that has the hexagonal crystal structure can be confirmed by analysis with XRD measurement. Specifically, a surface opposite to the base of each sample is irradiated with X-ray to perform X-ray diffraction measurement (XRD measurement) on a given region of the first layer for analysis. In the obtained XRD spectrum, when both of a peak described in JCPDS (ICDD) card 01-076-7103 and a peak described in JCPDS (ICDD) card 01-77-2001 are observed and when both of a peak described in JCPDS (ICDD) card 01-075-1012 and a peak described in JCPDS (ICDD) card 00-042-0853 are not observed, the first layer is confirmed to be composed of $W(C_{1-a}N_a)_x$ that has the hexagonal crystal structure.

When the coating includes layers other than the first layer, such as the second layer, the third layer, and an intermediate layer, peaks derived from the layers other than the first layer and the base (hereinafter, also referred to as "other peaks") may be detected in the XRD spectrum. In this case, the peak derived from the first layer is identified by the following method.

A surface of the measurement sample opposite to the base is irradiated with X-ray to perform XRD measurement on the coating, and a diffraction pattern A is obtained. A layer on the surface side (side irradiated with X-ray) relative to the first layer of the measurement sample is mechanically removed to expose the first layer. The exposed surface of the first layer is irradiated with X-ray to perform XRD measurement on the first layer, and a diffraction pattern B is obtained. The first layer of the measurement sample is mechanically removed to expose a layer on the base side relative to the first layer. The surface of the exposed layer is irradiated with X-ray to perform XRD measurement on the exposed layer, and a diffraction pattern C is obtained. The diffraction pattern A, the diffraction pattern B, and the diffraction pattern C are compared to identify the peak derived from the first layer. The X-ray diffraction spectrum in which the peak derived from the first layer has been identified by the above procedure is referred to as "X-ray diffraction spectrum of the first layer".

Examples of the apparatus used for the X-ray diffraction measurement include "SmartLab" (trade name), manufactured by Rigaku Corporation, and "X'pert" (trade name), manufactured by Malvern Panalytical Ltd.

Conditions of the XRD measurement herein are as follows.

(XRD Measurement Conditions)

Scanning axis: 2θ-θ

X-ray source: Cu-Kα radiation (1.541862 Å)

Detector: 0-dimensional detector (scintillation counter)

Tube voltage: 45 kV

Tube current: 40 mA

Incident optics: utilizing mirror

Receiving light optics: utilizing analyzer crystal (PW3098/27)

Step: 0.03°

Scanning time: 2 seconds

Scanning range (2θ): 10° to 120°

The X-ray diffraction spectrum of the first layer may have a peak within a range of a diffraction angle 2θ of 46.0° or more and 47.0° or less. The peak within the range of a diffraction angle 2θ of 46.0° or more and 47.0° or less (hereinafter, also referred to as "the first peak") is a peak derived from the hexagonal tungsten nitride. When the X-ray diffraction spectrum of the first layer has the first peak, that is, the first layer contains the hexagonal tungsten nitride, diffusion between the coating and the workpiece is inhibited to more improve the heat resistance of the coating.

As far as the measurement by the applicant, it has been confirmed that, as long as the analysis is performed on the same sample, the analysis results have almost no variation even when the analysis is performed a plurality of times with changing the measurement region, and that the result is not willful even with randomly setting the measurement region.

<Composition of First Layer>

The first layer is composed of the hexagonal $W(C_{1-a}N_a)_x$, a represents 0.3 or more and 0.8 or less, and x represents 0.8 or more and 1.2 or less.

A lower limit of a is 0.3 or more, may be 0.4 or more, or may be 0.5 or more. An upper limit of a is 0.8 or less, may be 0.7 or less, or may be 0.6 or less. a may be 0.4 or more and 0.7 or less, or may be 0.5 or more and 0.6 or less.

A lower limit of x is 0.8 or more, or may be 0.9 or more. An upper limit of x is 1.2 or less, or may be 1.1 or less. x may be 0.9 or more and 1.1 or less, or may be 1.0.

The term "the first layer is composed of the hexagonal $W(C_{1-a}N_a)_x$" herein means that the first layer may contain an inevitable impurity in addition to $W(C_{1-a}N_a)_x$ as long as the effect of the present disclosure is not impaired. Examples of the inevitable impurity include oxygen and carbon. A content rate of an entirety of the inevitable impurity in first layer 12 may be larger than 0 atom % and less than 1 atom %. The term "atom %" herein means a proportion (%) of the number of atoms relative to a total number of atoms to constitute the layer.

"a" described above is measured by using electron energy loss spectrometry (TEM-EELS). A specific measurement method is as follows.

The cutting tool is cut in a direction along a normal line of the surface of the coating by using an argon ion slicer to produce a slice with 3 to 100 nm in thickness that includes a cross section of the coating. The slice is observed with magnification of 100,000 to 1,000,000 by using a transmission electron microscope (TEM, trade name: "JEM-2100F/Cs", manufactured by JEOL Ltd.) to obtain a cross-sectional transmission image of the coating. The electron energy loss spectrometry (EELS method) is applied on the cross-sectional transmission image, and an observation spot with 10 nm square is scanned to observe an energy loss curve with excitation of carbon and nitrogen electrons. In the energy loss curve, a parallel strength of 270 to 280 eV is defined as a background strength of carbon, a parallel strength of 385 to 395 eV is defined as a background strength of nitrogen, and a ratio between the energy of carbon and the energy of nitrogen is calculated. According to this, "a" described above can be obtained.

In the composition $W(C_{1-a}N_a)_x$ of the first layer in the present disclosure, a ratio $A_{N1}/A_{M1}$ of a total number $A_{N1}$ of atoms of C and N relative to a number $A_{M1}$ of atoms of W is 0.8 or more and 1.2 or less. The ratio $A_{N1}/A_{M1}$ can be measured by a Rutherford backscattering (RBS) method. It has been confirmed that the effect of the present disclosure is not impaired when the ratio $A_{N1}/A_{M1}$ is within the above ranges.

<Average Thickness of First Layer>

A lower limit of the thickness of the first layer may be 0.2 μm or more. According to this, the diffusion reaction between the first layer and the workpiece is inhibited. A lower limit of the thickness of the first layer may be 0.3 μm or more, may be 0.5 μm or more, may be 0.7 μm or more, or may be 0.9 μm or more. An upper limit of the thickness of the first layer may be 5.0 μm or less. According to this, the coating has high hardness and good wear resistance. The upper limit of the thickness of the first layer may be 4.0 μm or less, may be 2.0 μm or less, or may be 1.5 μm or less. The thickness of the first layer may be 0.2 μm or more and 5.0 μm or less, may be 0.3 μm or more and 4.0 μm or less, may be 0.5 μm or more and 2.0 μm or less, or may be 0.7 μm or more and 1.5 μm or less.

<Second Layer>

As illustrated in FIG. 3 and FIG. 4, coating 14 may further include a second layer 13 provided on a side opposite to base 11 of first layer 12. Here, the term "provided on a side opposite to the base of the first layer" means that second layer 13 is provided on an upper side (side distanced from the base) of first layer 12, and does not require that first layer 12 and second layer 13 are contacted with each other. In other words, another layer may be provided between first layer 12 and second layer 13. Second layer 13 may be provided directly on first layer 12. Second layer 13 may be the outermost layer.

The second layer may be composed of: at least one element selected from a first group consisting of periodic table group 4 elements, group 5 elements, group 6 elements, aluminum (Al), and silicon (Si); or a compound composed of at least one element selected from the first group and at least one element selected from a second group consisting of carbon (C), nitrogen (N), oxygen (O), and boron (B). Examples of the periodic table group 4 elements include titanium (Ti), zirconium (Zr), and hafnium (Hf). Examples of the periodic table group 5 elements include vanadium (V), niobium (Nb), and tantalum (Ta). Examples of the periodic table group 6 elements include chromium (Cr), molybdenum (Mo), and tungsten (W). As long as the effect of the present disclosure is not impaired, the second layer may contain an impurity in addition to the at least one element selected from the first group or the above compounds.

The second layer may be composed of: at least one element selected from a first A group consisting of Cr, Al, Ti, and Si; or a compound composed of at least one element selected from the first A group and at least one element selected from the second group consisting of carbon, nitrogen, oxygen, and boron.

Examples of the compound that constitutes the second layer include AlTiBN, TiAlN, TiAlON, $Al_2O_3$, TiAlSiN, TiCrSiN, TiAlCrSiN, AlCrN, AlCrO, AlCrON, AlCrSiN, AlCrBN, TiZrN, TiAlMoN, TiAlNbN, TiSiN, AlCrTaN, AlVN, AlTiVN, $TiB_2$, TiCrHfN, CrSiWN, TiAlCN, TiSiCN, AlZrON, AlCrCN, AlHfN, CrSiBON, TiAlWN, AlCrMoCN, TiCN, TiCON, ZrN, and ZrCN. These compounds may reduce a frictional coefficient of the coating to attempt to lengthen the lifetime of the cutting tool.

A thickness of the second layer may be 0.1 μm or more. When the thickness of the second layer is 0.1 μm or more, an effect of imparting lubricity by the second layer is easily obtained. Meanwhile, an upper limit of the thickness of the second layer is not particularly limited, but if the thickness exceeds 2 μm, the aforementioned effect of imparting the lubricity tends to fail to be further improved. Thus, the thickness of the second layer may be 2 μm or less with considering a cost aspect.

<Third Layer>

As illustrated in FIG. 4, coating 14 may further include a third layer 15 disposed between base 11 and first layer 12. This can improve adhesiveness between base 11 and coating 14.

The third layer may be composed of: at least one element selected from a first group consisting of periodic table group 4 elements, group 5 elements, group 6 elements, aluminum (Al), and silicon (Si); or a compound composed of at least one element selected from the first group and at least one element selected from a second group consisting of carbon (C), nitrogen (N), oxygen (O), and boron (B). Examples of the periodic table group 4 elements include titanium (Ti), zirconium (Zr), and hafnium (Hf). Examples of the periodic table group 5 elements include vanadium (V), niobium (Nb), and tantalum (Ta). Examples of the periodic table group 6 elements include chromium (Cr), molybdenum (Mo), and tungsten (W). As long as the effect of the present disclosure is not impaired, the third layer may contain an impurity in addition to the at least one element selected from the first group or the above compounds.

The third layer may be composed of: at least one element selected from a first A group consisting of Cr, Al, Ti, and Si; or a compound composed of at least one element selected from the first A group and at least one element selected from the second group consisting of carbon, nitrogen, oxygen, and boron.

Examples of the compound that constitutes the third layer include TiWCN, TiN, TiAlN, TiAlON, $Al_2O_3$, TiAlSiN, TiCrSiN, TiAlCrSiN, AlCrN, AlCrO, AlCrON, AlCrSiN, AlCrBN, TiZrN, TiAlMoN, TiAlNbN, TiSiN, AlCrTaN, AlVN, AlTiVN, TiB$_2$, TiCrHfN, CrSiWN, TiAlCN, TiSiCN, AlZrON, AlCrCN, AlHfN, CrSiBON, TiAlWN, AlCrMoCN, TiCN, TiCON, ZrN, and ZrCN.

A thickness of the third layer is not particularly limited within a range that does not impair the effect of the present embodiment, but may be 0.1 μm or more and 2 μm or less, for example.

<Intermediate Layer>

The coating may include an intermediate layer disposed between the second layer and the first layer, or between the first layer and the third layer. Examples of the intermediate layer include TiAlCeN, AlTiN, AlTiBN, AlTiSiN, AlTiYN, and AlTiLaN. A thickness of the intermediate layer may be 0.1 μm or more and 2 μm or less, may be 0.3 μm or more and 1.5 μm or less, or may be 0.4 μm or more and 1.0 μm or less.

Embodiment 2: Method for Manufacturing Cutting Tool

Hereinafter, an example of a method for manufacturing the cutting tool of Embodiment 1 will be described. The method for manufacturing a cutting tool according to the present embodiment comprises: a first step of preparing a base; and a second step of forming a coating on the base. The second step comprises a step of forming a first layer. Each step will be described hereinafter.

<First Step>

In the first step, the base is prepared. As the base, the base described in Embodiment 1 may be used.

When a cemented carbide is used as the base, commercially available bases may be used, or the base may be manufactured by a common powder metallurgy method. When the base is manufactured by a common powder metallurgy method, WC powder, Co powder, and the like are mixed with a ball mill or the like to obtain a mixed powder. This mixed powder is dried, and then molded into a predetermined shape to obtain a molded article. Thereafter, the molded article is sintered to obtain a WC—Co-based cemented carbide (sintered material). Then, this sintered material may be subjected to a predetermined cutting-edge treatment such as a horning treatment to manufacture a base composed of the WC—Co-based cemented carbide. Any bases conventionally known as such a type of bases, other than the above base, may also be prepared.

<Second Step>

In the second step, the coating is formed on the base. The second step comprises a step of forming the first layer. Examples of the method for forming the first layer include a physical vapor deposition method (PVD method).

Examples of the PVD method include a sputtering method, an ion plating method, an arc-ion plating method, and an electron-ion beam deposition method. In particular, when a cathode arc-ion plating method or a sputtering method that has a high ionization rate of raw material elements is used, a metal or gas ion bombardment treatment for a surface of the base can be performed before the coating is formed. Thus, adhesiveness between the coating and the base is remarkably improved, which is preferable.

When the first layer is formed by the arc-ion plating method, examples of the conditions include the following. First, a WC target (for example, a binder-less WC with a composition that contains 93 mass % or more of WC, which is a sintering target with a C amount of 3 to 6.1 mass %) is set on two arc-type evaporation sources opposite to each other in an apparatus. A base temperature is set to 400 to 550° C., and a gas pressure in the apparatus is set to 1.5 to 5.5 Pa.

As the gas, only nitrogen (N$_2$) gas or a mixed gas of nitrogen gas and argon gas is introduced.

While keeping a base (negative) bias voltage to 10 to 150 V and DC or pulse DC (frequency: 20 to 50 kHz), an arc current at 80 to 150 A is supplied to a cathode electrode to generate metal ions and the like from the arc-type evaporation source, resulting in formation of the first layer on the base. During the film formation, a tungsten filament also discharges (emission current: 30 to 45 A). According to this, ions in plasma can be increased. Examples of the used apparatus for the arc-ion plating method include AIP (trade name), manufactured by KOBE STEEL, LTD. The base temperature, the gas pressure, the bias voltage, the frequency, the arc current, and the emission current in forming the film are constant within the above ranges.

Under the above conditions, the first layer composed of hexagonal W(C$_{1-a}$N$_a$)$_x$ (a represents 0.3 or more and 0.8 or less, and x represents 0.8 or more and 1.2 or less) can be formed. The above conditions are novelly found as a result of intensive investigation by the present inventors. By regulating the gas composition, the gas pressure, the arc current, and the bias voltage within the above ranges, a composition of the first layer and presence/absence of a first peak (a peak within a range of a diffraction angle 2θ of 46.0° or more and 47.0° or less) in an XRD spectrum of the first layer may be regulated. For example, a large amount of nitrogen in the gas or a large bias voltage tends to decrease a proportion of carbon (C) in the coating. A low gas pressure and a low partial pressure of nitrogen tend to eliminate the first peak.

The second step may comprise, in addition to the step of forming the first layer, a step of treating a surface of the coating, such as polishing and shot blasting. The second step may also comprise a step of forming other layers such as a second layer, a third layer, and an intermediate layer. The other layers can be formed by a conventionally known chemical vapor deposition method or physical vapor deposition method. From the viewpoint of ability to form the other layer continuously to the first layer in one physical vapor deposition apparatus, the other layer is preferably formed by a physical vapor deposition method.

EXAMPLES

Hereinafter, the present invention will be described in detail with Examples, but the present invention is not limited thereto.

Production of Cutting Tool

[Sample 1 to Sample 22 and Sample 101 to Sample 105]

<First Step>

In the first step, a cemented carbide of JIS Standard K10 grade (shape: JIS Standard CNMG120408) was prepared as a base. Then, the base was set at a predetermined position in an arc-ion plating apparatus (manufactured by KOBE STEEL, LTD., trade name: AIP).

<Second Step>

In the second step, a coating that included a first layer was formed on the base by an arc-ion plating method to obtain a cutting tool of each Sample. The first layer was formed by the following method. First, a WC target (a binder-less WC with a composition that contained 93 mass % or more of WC, which was a sintering target with a C amount of 3 to 6.1 mass %) was set on two arc-type evaporation sources opposite to each other in the apparatus. A base temperature was set to 400 to 550° C., and a gas pressure in the apparatus was set to 1.5 to 5.5 Pa.

As the gas, only nitrogen ($N_2$) gas or a mixed gas of nitrogen gas and argon gas was introduced.

In Sample 1 to Sample 22, while keeping a base (negative) bias voltage to 10 to 150 V and DC or pulse DC (frequency: 20 to 50 kHz), an arc current at 80 to 150 A was supplied to a cathode electrode to generate metal ions and the like from the arc-type evaporation source, resulting in formation of the first layer on the base. During the film formation, a tungsten filament also discharged (emission current: 30 to 45 A). The base temperature, the gas pressure, the bias voltage, the frequency, and the emission current in forming the film were constant within the above ranges. In each Sample, by regulating the gas composition, the gas pressure, the arc current, and the bias voltage within the above ranges, a composition of the first layer and presence/absence of a first peak (a peak within a range of a diffraction angle 2θ of 46.0° or more and 47.0° or less) in an XRD spectrum of the first layer were regulated.

In Sample 20, a third layer was provided between the base and the first layer. The third layer was formed directly on the base in the following procedure before the first layer was formed. A target (sintering target) that contained a metal composition in the column "Composition of third layer" of Table 1 was set on the arc-type evaporation source in the arc-ion plating apparatus. Then, the base temperature was set to 600° C. and the gas pressure in the apparatus was set to 3.5 Pa. As a reaction gas, a mixed gas of nitrogen gas, methane gas, and argon gas was introduced. Thereafter, arc current of 130 A was supplied to the cathode electrode. Supplying the arc current generates metal ions and the like from the arc-type evaporation source to form the third layer to a thickness shown in Table 1.

In Sample 19, a second layer was provided on the first layer. The second layer was formed directly on the first layer in the following procedure after the first layer was formed. A target (sintering target) that contained a metal composition in the column "Composition of second layer" described in Table 1 was set on the arc-type evaporation source in the arc-ion plating apparatus. Then, the base temperature was set to 550° C. and the gas pressure in the apparatus was set to 4.0 Pa. As a reaction gas, nitrogen was introduced. Thereafter, arc current of 150 A was supplied to the cathode electrode. Supplying the arc current generates metal ions and the like from the arc-type evaporation source to form the second layer to a thickness shown in Table 1.

In Sample 101, a film was formed under the same conditions as in Sample 1 to Sample 22 except that the gas pressure was 1.0 Pa, a mixed gas of nitrogen gas and argon gas was introduced, and the bias voltage was 100 V.

In Sample 102 and Sample 103, a film was formed under the same conditions as in Sample 1 to Sample 22 except that the gas pressure was 1.0 Pa, only nitrogen gas was introduced, and the arc current and the bias voltage were changed so that a and x in the hexagonal $W(C_{1-a}N_a)_x$ were values shown in Table 1.

In Sample 104, a film was formed under the same conditions as in Sample 1 to Sample 22 except that the gas pressure was 4.0 Pa, a mixed gas of nitrogen gas and argon gas was introduced, the bias voltage was 200 V, and the arc current was 150 A.

In Sample 105, a film was formed under the same conditions as in Sample 1 to Sample 22 except that the gas pressure was 5.0 Pa, a mixed gas of nitrogen gas and argon gas was introduced, the bias voltage was 500 V, and the arc current was 190 A.

[Sample 106]

A base same as in Sample 1 was prepared, and a coating was formed on the base in the same manner as in Sample 15 of PTL 1 to obtain a cutting tool of Sample 106.

Characteristics Evaluation of Cutting Tool

A crystal structure of the first layer, presence/absence of the first peak, a composition of the first layer, and a thickness of each layer of the cutting tool of each Sample were evaluated.

<Crystal Structure of First Layer and Presence/Absence of First Peak>

The crystal structure of the first layer of each Sample was specified by XRD. The specific measurement method is described in Embodiment 1, and thus the description is not repeated. The results are shown in the column "Crystal structure" of "First layer" of Table 1.

The description "Hexagonal" in the column "Crystal structure" represents that the first layer does not contain tungsten carbide or tungsten nitride composed of a cubic crystal stricture, and that the first layer is composed of the hexagonal $W(C_{1-a}N_a)_x$ composed of the hexagonal crystal structure.

The description "Hexagonal+Cubic" in the column "Crystal structure" represents that the first layer includes a mixture of: hexagonal tungsten nitride (hexagonal WN), hexagonal tungsten carbide (hexagonal WC), and at least one of cubic WN and $W_3C$. When at least one of a peak described in JCPDS (ICDD) card 01-075-1012 (WN) and a peak described in JCPDS (ICDD) card 00-042-0853 ($W_3C$) is observed in the XRD spectrum of the first layer, the first layer includes the cubic crystal structure.

The description "W+h$W_2C$" of Sample 106 in the column "Crystal structure" represents that the first layer is composed of metal tungsten and hexagonal ditungsten carbide.

In the X-ray diffraction spectrum of the first layer obtained in each Sample, whether the peak was present or absent within a range of a diffraction angle 2θ of 46.0° or more and 47.0° or less was checked. The results are shown in the column "XRD spectrum: first peak" of "First layer" of Table 1. The description "present" represents presence of the first peak, and the description "absent" represents absence of the first peak.

<Compositions of First Layer, Second Layer, and Third Layer>

A composition of the first layer of each Sample was measured by using electron energy loss spectrometry (TEM-EELS) and a Rutherford backscattering (RBS) method. When the second layer and the third layer were formed, compositions thereof were also measured. The specific measurement method is described in Embodiment 1, and thus the description is not repeated. The results are shown in the columns "a" and "x" of "First layer $(C_{1-a}N_a)_x$", the column "Composition" of "Second layer", and the column "Composition" of "Third layer" of Table 1.

<Thickness of Each Layer>

Thicknesses of the first layer, the second layer, the third layer, and the coating were measured by using a transmission electron microscope (TEM) (manufactured by JEOL Ltd., trade name: JEM-2100F). The specific measurement method is described in Embodiment 1, and thus the description is not repeated. The results are shown in the column "Thickness" of each layer of Table 1.

In Table 1, the description "-" in "Second layer" and "Third layer" represents that the corresponding layer is absent in the coating.

TABLE 1

| Sample No. | First layer (W(C$_{1-a}$N$_a$)x) | | | | | Second layer | | Third layer | | Thickness of coating [μm] |
|---|---|---|---|---|---|---|---|---|---|---|
| | a | x | Crystal structure | XRD spectrum: first peak | Average thickness [μm] | Composition | Thickness [μm] | Composition | Thickness [μm] | |
| 1 | 0.3 | 0.8 | Hexagonal | absent | 0.30 | — | — | — | — | 0.30 |
| 2 | 0.3 | 1.0 | Hexagonal | present | 0.30 | — | — | — | — | 0.30 |
| 3 | 0.3 | 1.2 | Hexagonal | present | 0.30 | — | — | — | — | 0.30 |
| 4 | 0.5 | 1.0 | Hexagonal | present | 0.30 | — | — | — | — | 0.30 |
| 5 | 0.8 | 0.8 | Hexagonal | present | 0.30 | — | — | — | — | 0.30 |
| 6 | 0.8 | 1.0 | Hexagonal | present | 0.30 | — | — | — | — | 0.30 |
| 7 | 0.8 | 1.2 | Hexagonal | present | 0.30 | — | — | — | — | 0.30 |
| 8 | 0.3 | 0.8 | Hexagonal | present | 4.00 | — | — | — | — | 4.00 |
| 9 | 0.3 | 1.0 | Hexagonal | present | 4.00 | — | — | — | — | 4.00 |
| 10 | 0.3 | 1.2 | Hexagonal | present | 4.00 | — | — | — | — | 4.00 |
| 11 | 0.5 | 1.0 | Hexagonal | present | 4.00 | — | — | — | — | 4.00 |
| 12 | 0.8 | 0.8 | Hexagonal | present | 4.00 | — | — | — | — | 4.00 |
| 13 | 0.8 | 1.0 | Hexagonal | present | 4.00 | — | — | — | — | 4.00 |
| 14 | 0.8 | 1.2 | Hexagonal | present | 4.00 | — | — | — | — | 4.00 |
| 15 | 0.5 | 1.0 | Hexagonal | absent | 2.00 | — | — | — | — | 2.00 |
| 16 | 0.6 | 0.9 | Hexagonal | present | 0.20 | — | — | — | — | 0.20 |
| 17 | 0.6 | 1.0 | Hexagonal | present | 5.00 | — | — | — | — | 5.00 |
| 18 | 0.7 | 1.0 | Hexagonal | present | 0.90 | — | — | — | — | 0.90 |
| 19 | 0.7 | 1.0 | Hexagonal | present | 0.90 | AlTiBN | 2.00 | — | — | 2.90 |
| 20 | 0.5 | 1.0 | Hexagonal | absent | 2.00 | — | — | TiWCN | 0.05 | 2.05 |
| 21 | 0.4 | 0.9 | Hexagonal | present | 0.90 | — | — | — | — | 0.90 |
| 22 | 0.4 | 1.1 | Hexagonal | present | 2.00 | — | — | — | — | 2.00 |
| 101 | 0.2 | 1.0 | Hexagonal | absent | 2.00 | — | — | — | — | 2.00 |
| 102 | 0.9 | 1.0 | Hexagonal | present | 3.00 | — | — | — | — | 3.00 |
| 103 | 0.6 | 0.7 | Hexagonal | absent | 1.00 | — | — | — | — | 1.00 |
| 104 | 0.5 | 1.3 | Hexagonal | present | 2.00 | — | — | — | — | 2.00 |
| 105 | 0.3 | 1.2 | Hexagonal + cubic | absent | 2.00 | — | — | — | — | 2.00 |
| 106 | — | — | W + hW2C | absent | 0.90 | — | — | — | — | 0.90 |

Cutting Test

By using the cutting tool of each Sample, a cutting time (tool lifetime) was measured under the following cutting conditions until the cutting tool caused breakage or until a wear amount of a flank face reached 0.15 mm. The results are shown in the column "Tool lifetime" of "Cutting test" of Table 2.

<Cutting Conditions>
Workpiece (material): Ti-6Al-4V
Cutting speed: V 70 m/min
Feeding: 0.2 mm/rev
Cutting depth: 1 mm The above cutting conditions correspond to turning of titanium alloy, and a high thermal load is applied to the cutting tool during processing.

TABLE 2

| Sample No. | Cutting test |
|---|---|
| 1 | 28 min 45 sec |
| 2 | 29 min 00 sec |
| 3 | 28 min 50 sec |
| 4 | 32 min 30 sec |
| 5 | 30 min 45 sec |
| 6 | 31 min 30 sec |
| 7 | 31 min 15 sec |
| 8 | 32 min 00 sec |
| 9 | 31 min 00 sec |
| 10 | 32 min 30 sec |
| 11 | 37 min 45 sec |
| 12 | 33 min 15 sec |
| 13 | 33 min 30 sec |
| 14 | 34 min 15 sec |
| 15 | 28 min 40 sec |
| 16 | 28 min 45 sec |
| 17 | 29 min 00 sec |
| 18 | 29 min 00 sec |
| 19 | 50 min 00 sec |
| 20 | 30 min 45 sec |
| 21 | 29 min 00 sec |
| 22 | 28 min 55 sec |
| 101 | 18 min 00 sec |
| 102 | 17 min 00 sec |
| 103 | 18 min 45 sec |
| 104 | 27 min 30 sec |
| 105 | 15 min 10 sec |
| 106 | 28 min 30 sec |

The cutting tools of Sample 1 to Sample 22 correspond to Examples, and the cutting tools of Sample 101 to Sample 106 correspond to Comparative Examples. From the results of the cutting test, it has been confirmed that the cutting tools of Sample 1 to Sample 22 have a longer tool lifetime than the cutting tools of Sample 101 to Sample 106 even under an environment of a high thermal load.

The embodiments and Examples of the present invention have been described as above, but it is anticipated in advance that the aforementioned constitution of embodiments and Examples are appropriately combined.

The embodiments and Examples disclosed herein are examples in all points, and should not be limitative. The scope of the present invention is determined by not the above embodiments nor Examples but claims, and intended to include meaning equivalent to claims and all modification within the scope.

REFERENCE SIGNS LIST

1 Rake face; 2 Flank face; 3 Cutting edge ridgeline; 10 Cutting tool; 11 Base; 12 First layer, 13 Second layer, 14 Coating; 15 Third layer

The invention claimed is:
1. A cutting tool, comprising:
a base; and
a coating disposed on the base, wherein
the coating includes a first layer composed of hexagonal $W(C_{1-a}N_a)_x$,
a represents 0.3 or more and 0.8 or less, and
x represents 0.8 or more and 1.2 or less,
wherein
an X-ray diffraction spectrum of the first layer has a peak within a range of a diffraction angle 2θ of 46.0° or more and 47.0° or less.

2. The cutting tool according to claim 1, wherein an average thickness of the first layer is 0.3 μm or more and 4.0 μm or less.

3. The cutting tool according to claim 1, wherein
the coating further includes a second layer provided on a side opposite to the base of the first layer, and
the second layer is composed of: at least one element selected from a first group consisting of periodic table group 4 elements, group 5 elements, group 6 elements, aluminum, and silicon; or a compound composed of at least one element selected from the first group and at least one element selected from a second group consisting of carbon, nitrogen, oxygen, and boron.

4. The cutting tool according to claim 1, wherein the base contains at least one selected from the group consisting of a cemented carbide, a cermet, a high-speed steel, a ceramic, a cubic boron nitride sintered material, and a diamond sintered material.

5. The cutting tool according to claim 1, wherein x is between 0.8 and 1.

6. The cutting tool according to claim 1, wherein x is between 1 and 1.2.

7. The cutting tool according to claim 1, wherein
the coating further includes a third layer disposed between the base and the first layer, and
the third layer is composed of: at least one element selected from a first group consisting of periodic table group 4 elements, group 5 elements, group 6 elements, aluminum, and silicon; or a compound composed of at least one element selected from the first group and at least one element selected from a second group consisting of carbon, nitrogen, oxygen, and boron.

8. The cutting tool according to claim 1, wherein the cutting tool further comprises an intermediate layer disposed between the first layer and the third layer, and
the intermediate layer includes TiAlCeN, AlTiN, AlTiBN, AlTiSiN, AlTiYN or AlTiLaN.

9. The cutting tool according to claim 8, wherein a thickness of the intermediate layer is between 0.4 μm to 1.0 μm.

* * * * *